(12) United States Patent
Mouli

(10) Patent No.: US 7,427,798 B2
(45) Date of Patent: *Sep. 23, 2008

(54) PHOTONIC CRYSTAL-BASED LENS ELEMENTS FOR USE IN AN IMAGE SENSOR

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 443 days.

This patent is subject to a terminal disclaimer.

(21) Appl. No.: 10/886,125

(22) Filed: Jul. 8, 2004

(65) Prior Publication Data

US 2006/0006485 A1    Jan. 12, 2006

(51) Int. Cl.
*H01L 31/0232* (2006.01)
*H01L 29/04* (2006.01)

(52) U.S. Cl. .................... 257/432; 257/72; 438/48; 438/65

(58) Field of Classification Search ............... 257/432, 257/72, 431; 438/48, 65
See application file for complete search history.

(56) References Cited

OTHER PUBLICATIONS

R. Biswas et al.—"Photonic band gaps of porous solids," The American Physical Society, Physical Review B, vol. 61, No. 7, Articles, Feb. 15, 2000, pp. 4549-4553.
M. J. Cryan et al.—"Design and Simulation of a Photonic Crystal Waveguide Filter Using the FDTD Method," IEEE, 2002, pp. 669-670.
H. Han et al.—"Terahertz pulse propagation in a plastic photonic crystal fiber," American Institute of Physics, Applied Physics Letters, vol. 80, No. 15, Apr. 15, 2002, pp. 2634-2636.
Pantanjali V. Parimi et al.—"Imaging by a Flat Lens due to Negative Refraction," Nature Publishing Group, vol. 426, Nov. 2003, pp. 1-4 and p. 404.
J.B. Pendry—"Negative Refraction Makes a Perfect Lens," The American Physical Society, Physical Review Letters, vol. 85, No. 18, Oct. 30, 2000, pp. 3966-3969.
E. Rave et al.—"Infrared photonic crystal fiber," American Institute of Physics, Applied Physics Letters, vol. 83, No. 10, Sep. 8, 2003, pp. 1912-1914.
K. Matsuda et al.—"Tunable single-photon source using Korteweg-de Vries solitions," American Institute of Physics, Applied Physics Letters, vol. 81, No. 15, Oct. 7, 2002, pp. 2698-2700.
A. C. Stevenson et al.—"Detection of acoustic solitary waves in nonlinear lithium niobate crystals," American Institute of Physics, Applied Physics Letters, vol. 82, No. 16, Apr. 21, 2003, pp. 2733-2735.

*Primary Examiner*—Ori Nadav
(74) *Attorney, Agent, or Firm*—Dickstein Shapiro LLP

(57) ABSTRACT

The invention, in various exemplary embodiments, incorporates a photonic crystal lens element into an image sensor. The photonic crystal lens element comprises a substrate and a plurality of pillars forming a photonic crystal structure over the substrate. The pillars are spaced apart from each other. Each pillar has a height and a horizontal cross sectional shape. A material with a different dielectric constant than the pillars is provided within the spacing between the pillars. The photonic crystal element can be a lens configured to focus electromagnetic radiation onto an underlying pixel cell.

26 Claims, 17 Drawing Sheets

PHOTONIC CRYSTAL-BASED LENS ELEMENTS FOR USE IN AN IMAGE SENSOR

FIELD OF THE INVENTION

The present invention relates generally to the field of semiconductor devices and more particularly to lens elements utilized in image sensor devices or displays.

BACKGROUND OF THE INVENTION

The semiconductor industry currently uses different types of semiconductor-based image sensors that use micro-lenses, such as charge coupled devices (CCDs), CMOS active pixel sensors (APS), photodiode arrays, charge injection devices and hybrid focal plane arrays, among others. These image sensors use micro-lenses to focus electromagnetic radiation onto the photo-conversion device, e.g., a photodiode. Also, these image sensors can use filters to select particular wavelengths of electromagnetic radiation for sensing by the photo-conversion device.

Micro-lenses of an image sensor help increase optical efficiency and reduce cross talk between pixel cells. FIG. 1A shows a portion of a CMOS image sensor pixel cell array 100. The array 100 includes pixel cells 10, each being formed on a substrate 1. Each pixel cell 10 includes a photo-conversion device 12, for example, a photodiode. The illustrated array 100 has micro-lenses 20 that collect and focus light on the photo-conversion devices 12. The array 100 can also include a light shield, e.g., a metal layer 7, to block light intended for one photo-conversion device from reaching other photo-conversion devices of the pixel cells 10.

The array 100 can also include a color filter array 30. The color filter array includes color filters 31a, 31b, 31c, each disposed over a pixel cell 10. Each of the filters 31a, 31b, 31c allows only particular wavelengths of light to pass through to a respective photo-conversion device. Typically, the color filter array 30 is arranged in a repeating Bayer pattern and includes two green color filters 31a, a red color filter 31b, and a blue color filter 31c, arranged as shown in FIG. 1B.

Between the color filter array 30 and the pixel cells 10 is an interlayer dielectric (ILD) region 3. The ILD region 3 typically includes multiple layers of interlayer dielectrics and conductors that form connections between devices of the pixel cells 10 and from the pixel cells 10 to circuitry (not shown) peripheral to the array 100. Between the color filter array 30 and the micro-lenses 20 is a dielectric layer 5.

Conventional optical lenses, including micro-lenses 20, use curved surfaces, either concave or convex, to refract electromagnetic waves to converge or diverge, but cannot focus light onto an area smaller than a square wavelength. Micro-lenses 20 are typically made of an oxide with a positive refractive index of around 1.3 to 1.8. Since materials used in these conventional optical lens elements have a positive refractive index, it is necessary that the micro-lenses 20 have curved surfaces to create a focal point close to the active area of the photo-conversion device 12.

A reduction of the size of the pixel cells 10 allows for a greater density of pixel cells to be arranged in the array 100, desirably increasing the resolution of the array 100. Typically, the size of each micro-lens 20 is correlated to the size of the pixel cells 10. Thus, as the pixel cells 10 decrease in size, the size of each micro-lens 20 must also decrease. Disadvantageously, however, conventional micro-lenses 20 do not scale very well. A reduction in size of micro-lenses 20 is limited by optical and resulting electrical performance. As conventional micro-lenses 20 are scaled to smaller sizes approaching the diffraction limit, the light gathering power, which is an indirect measure of external quantum efficiency, decreases significantly. Accordingly, as pixel cells 10 are scaled, creating micro lenses 20 with desired properties, e.g., curvature, focal length, no or minimal loss due to diffraction and interference, among others, is difficult. Therefore, it would be advantageous to have an improved lens for use in image sensors to allow better scaling of pixel cells and/or enhanced image sensor performance.

BRIEF SUMMARY OF THE INVENTION

The invention, in various exemplary embodiments, incorporates a photonic crystal lens element into an image sensor. The photonic crystal lens element comprises a substrate and a plurality of pillars forming a photonic crystal structure over the substrate. The pillars are spaced apart from each other. Each pillar has a height and a horizontal cross sectional shape. A material with a different dielectric constant than the pillars is provided within the spacing between the pillars. The photonic crystal element can be a lens configured to focus electromagnetic radiation onto an underlying pixel cell.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1A:
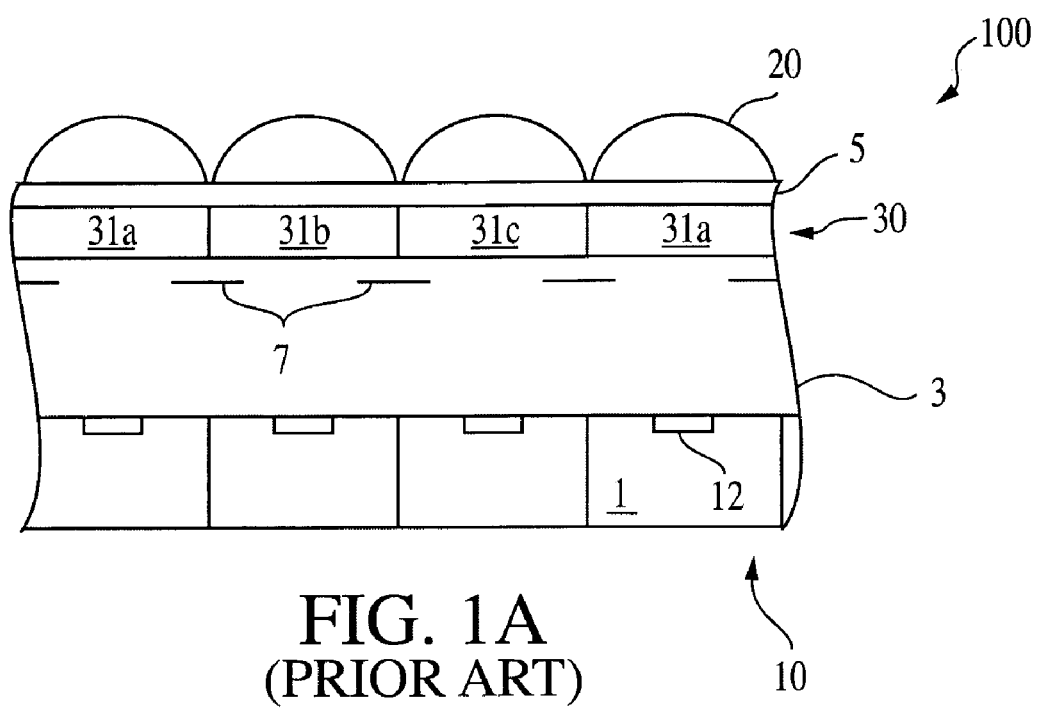
FIG. 1A is a cross sectional view of a portion or a conventional image sensor array.
Figure 1B:
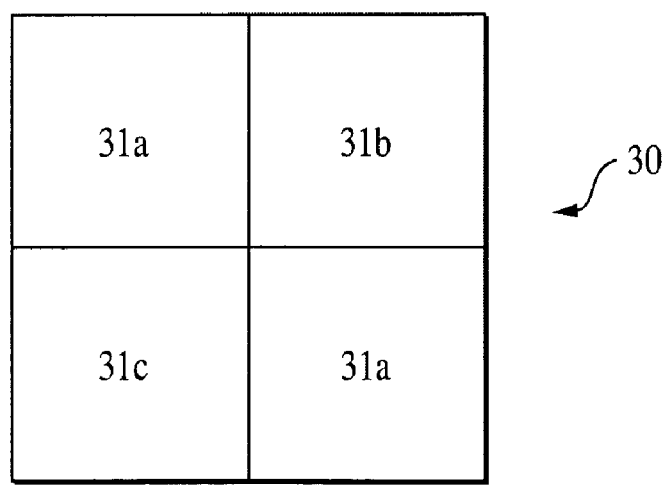
FIG. 1B is a block diagram of a portion of a conventional color filter array.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device for converting electromagnetic radiation to an electrical signal. Typically, the fabrication of all pixel cells in an image sensor will proceed concurrently in a similar fashion.

The term "photonic crystal" refers to a material and/or lattice of structures (e.g. an arrangement of pillars) with a periodic alteration in the index of refraction. A "photonic crystal element" is an element that comprises a photonic crystal structure.

Embodiments of the invention provide photonic crystal lens elements and an image sensor employing photonic crystal lens elements. Photonic crystals have recently been recognized for their photonic band gaps. A photonic crystal interacts with electromagnetic waves analogously to how a semiconductor crystal interacts with charge particles or their wave forms, i.e., photonic crystal structures are optical analogs of semiconductor crystal structures. The fundamental aspect of both photonic and semiconductor crystals is their periodicity. In a semiconductor, the periodic crystal structure of atoms in a lattice is one of the primary reasons for its observed properties. For example, the periodicity of the structure allows quantization of energy (E) levels and wave vector momentum (k) levels (band structure, E-k relationships). In a similar manner, photonic crystals have structures that allow the tailoring of unique properties for electromagnetic wave propagation. Similar to band gap energy in semiconductors, where carrier energies are forbidden, photonic crystals can provide a photonic band gap for electromagnetic waves, where the presence of particular wavelengths is forbidden. See Biswas, R. et al., *Physical Review B*, vol. 61, no. 7, pp. 4549-4553 (1999), the entirety of which is incorporated herein by reference.

Unlike semiconductors, photonic crystals are not limited to naturally occurring materials and can be synthesized easily. Therefore, photonic crystals can be made in a wide range of structures to accommodate the wide range of frequencies and wavelengths of electromagnetic radiation. Electromagnetic waves satisfy the simple relationship to the velocity of light:

$$c = n\lambda$$

where c=velocity of light in the medium of interest, n=frequency and λ=wavelength. Radio waves are in the 1 millimeter (mm) range of wavelengths whereas extreme ultraviolet rays are in the 1 nanometer (nm) range. While band structure engineering in semiconductors is very complex, photonic band structure engineering in photonic crystals it is relatively simple. Photonic crystals can be engineered to have a photonic band structure that blocks particular wavelengths of light while allowing other wavelengths to pass through.

Photonic crystals can also demonstrate negative refraction. As noted above, conventional micro-lenses 20 (FIG. 1A) have a positive refractive index, and therefore, a curved surface. If, however, a material that shows a negative refractive index is used, it is possible to refract electromagnetic waves without the need for a curved surface. This means a "flat lens" made of a material with a negative refractive index can have similar properties as a curved lens made of a material with a positive refractive index. See Parimi, Patanjali V. et al., *Nature*, vol. 426, p. 404 (2003), the entirety of which is incorporated herein by reference, for a discussion of experimental results demonstrating negative refraction at microwave frequencies. See also Pendry, J. B., *Physics Review Letters*, vol. 85, no. 18, pp. 3966-3969 (2000), which is incorporated herein by reference.

Conventional silicon dioxide ($SiO_2$) based micro-lenses 20 (with refractive index of around 1.5) have a single optical axis and rather limited aperture. The lenses 20 cannot focus light into an area smaller than the square of the wavelength of light that is incident on them. A flat lens with a negative refractive index is not restricted by aperture size and can provide effective lenses even as image sensors are scaled to smaller sizes.

Referring to the figures, FIGS. 2, 5, 7, 8, 10, and 11-13 depict a portion of image sensor pixel cell arrays 200A-G, respectively, each including photonic crystal lens elements constructed according to exemplary embodiments of the invention. For illustrative purposes, image sensor pixel cell arrays 200A-G are CMOS image sensor arrays including CMOS pixel cells 10. It should be readily understood that embodiments of the invention also include CCD and other image sensors.

Figure 2:
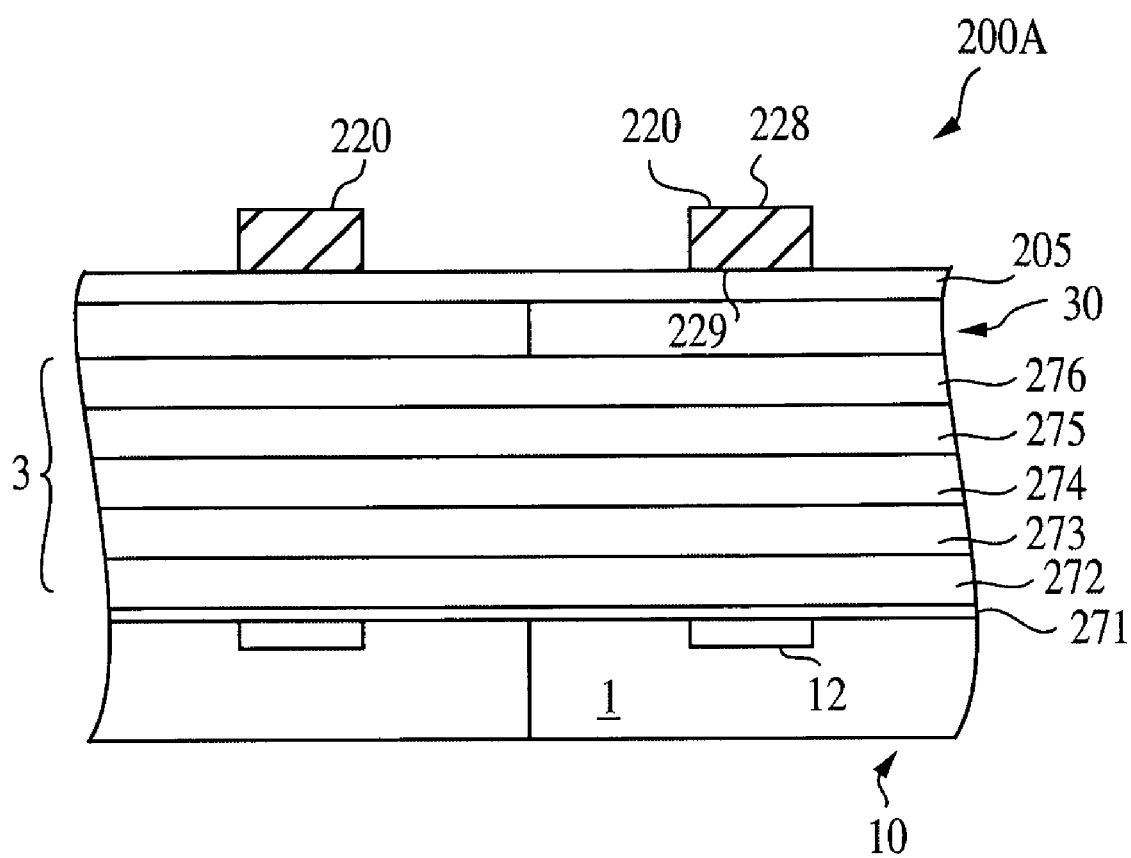
FIG. 2 is a cross sectional view of a portion of an image sensor array including photonic crystal lenses according to an exemplary embodiment of the invention.

FIG. 2 depicts a portion of an image sensor pixel cell array 200A according to an exemplary embodiment of the invention. The illustrated array 200 is partially similar to the array 100 depicted in FIG. 1A. The array 200A includes pixel cells 10 having photo-conversion devices 12, ILD region 3, and an optional color filter array 30. Instead of micro-lenses 20, however, the array 200A includes photonic crystal lens elements, lenses 220, over the photo-conversion devices 12. Preferably, the lenses 220 have an approximately flat surface. That is, a top surface 228 and a bottom surface 229 of lenses 220 are approximately parallel. The lenses 220 are formed on a lens base 205 as a layer 260, which includes a photonic crystal structure. The photonic crystal structure of layer 260 can be varied to achieve desired lens 220 characteristics such as, e.g., a desired photonic band structure and/or a negative refractive index.

The ILD region 3 can have the exemplary structure shown in FIG. 2. A layer 271 of tetraethyl orthosilicate (TEOS) is over the substrate 1 and the devices formed thereon, including the photo-conversion devices 12 and, e.g., transistors (not shown) of the pixel cells 10. Over the TEOS layer 271, there is a layer 272 of borophosphosilicate glass (BPSG) followed by first, second, and third interlayer dielectric layers 273, 274, 275, respectively. A passivation layer 276 is over the third interlayer dielectric layer 275. There are also conductive structures, e.g., metal lines, forming connections between devices of the pixel cells 10 and from the pixel cell 10 devices to external devices (not shown).

FIGS. 3A-3G depict process steps for forming the array 200A (FIG. 2). No particular order is required for any of the actions described herein, except for those logically requiring the results of prior actions. Accordingly, while the actions below are described as being performed in a general order, the order is exemplary only and can be altered.

Figure 3A:
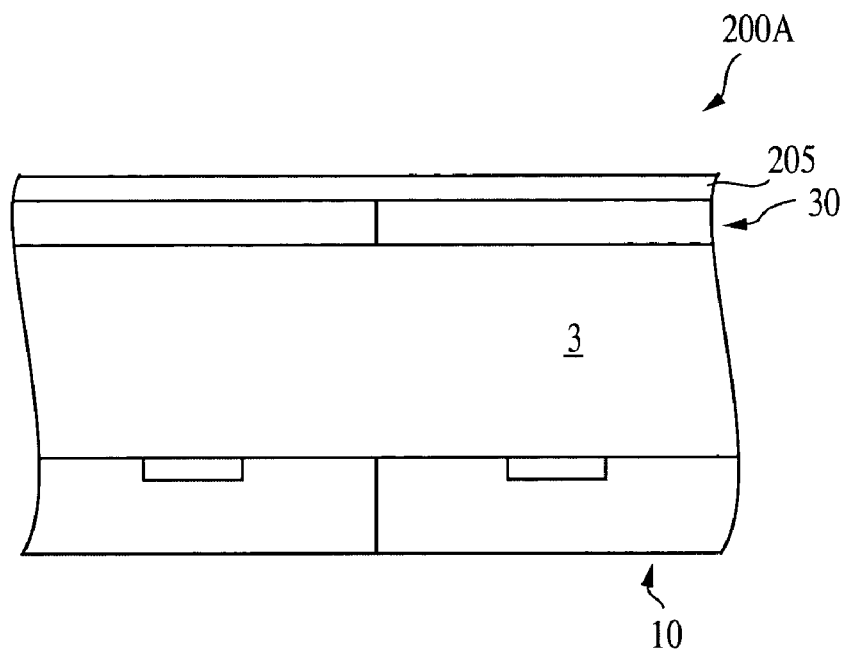
FIGS. 3A-3G illustrates intermediate stages of fabrication of the image sensor array of FIG. 2 according to an exemplary embodiment of the invention.

Referring to FIG. 3A, the pixel cells 10, including the photo-conversion devices 12; ILD region 3, including multiple interlayer dielectric layers, conductive lines (e.g., metal lines), contacts, and connections (not shown), among others; and an optional color filter array 30 are first formed by any known method. As shown in FIG. 3A, a lens base layer 205 is formed over the color filter array 30. The lens base layer 205 can be any suitable material that provides an approximately flat surface on which the photonic crystal structure of lenses 220 can be formed. For example, lens base layer 205 can be a dielectric layer e.g., a layer of $SiO_2$, and can have a thickness within the range of approximately 50 Angstroms (Å) to approximately 200 Å.

Figure 3B:
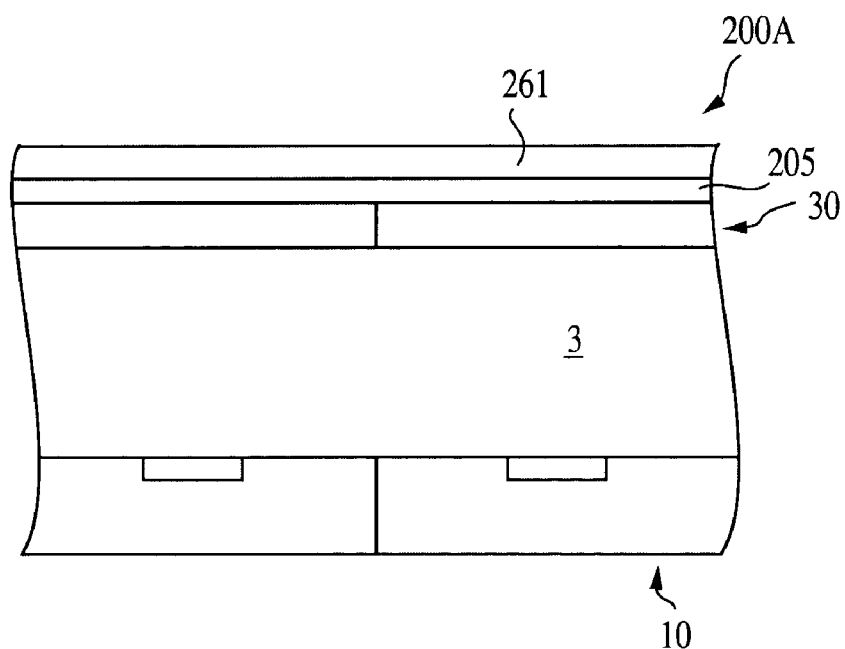

As shown in FIG. 3B, a layer 261 of material suitable for forming a photonic crystal is formed over the lens base layer 205. Alternatively, when the array 200A does not include a color filter array 30 and the lens 220 is to be located on the ILD region 3, layer 261 can be formed on an interlayer dielectric layer of e.g., a layer of borophosphosilicate glass (BPSG), or other interlayer dielectric material.

Examples of materials suitable for forming layer 261 include aluminum oxide ($Al_2O_3$), tantalum oxide ($Ta_2O_3$), zirconium oxide ($ZrO_2$), hafnium oxide ($HfO_2$), and hafnium-based silicates, among others. It should be noted that certain materials can yield a photonic crystal that absorbs a portion of the photons. If the absorption is excessive, quantum efficiency can be detrimentally affected. Preferably, layer 261 is a layer of $Al_2O_3$ since it offers less absorption and is similar to $SiO_2$ in its barrier properties. The thickness of layer 261 can be chosen as needed or desired. Preferably, layer 261 is formed having a thickness within the range of approximately 100 Å to approximately 5000 Å.

Figure 3C:
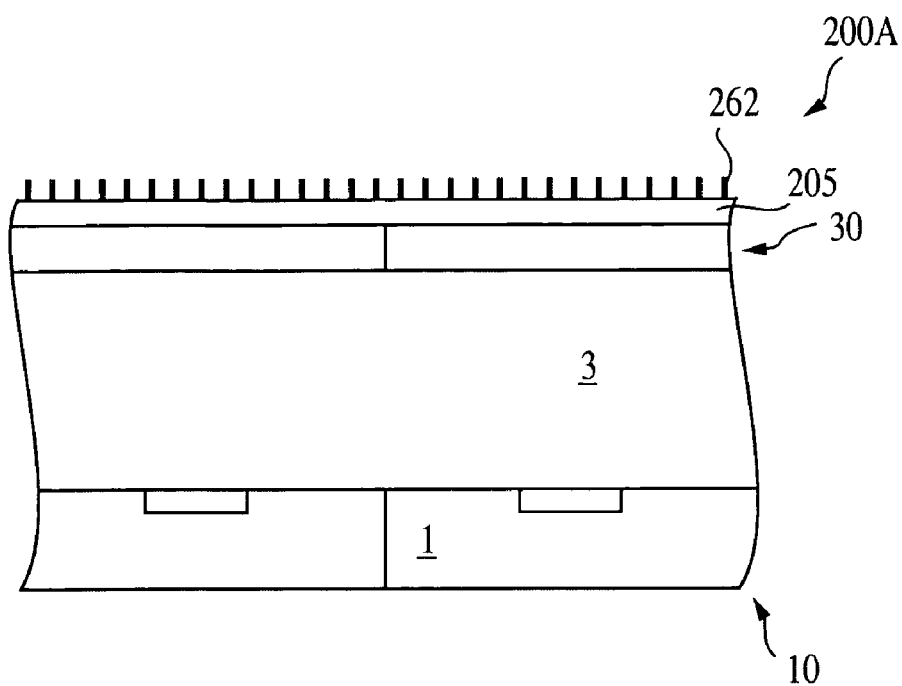
Figure 3D:
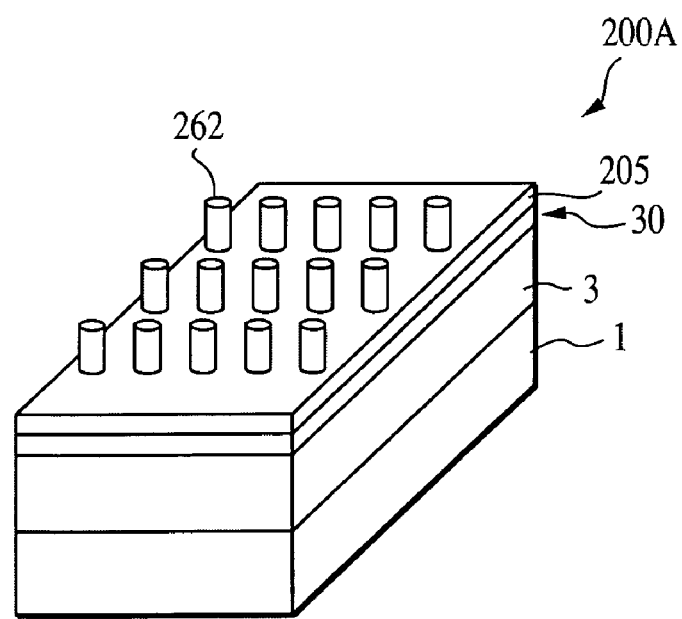
Figure 3E:
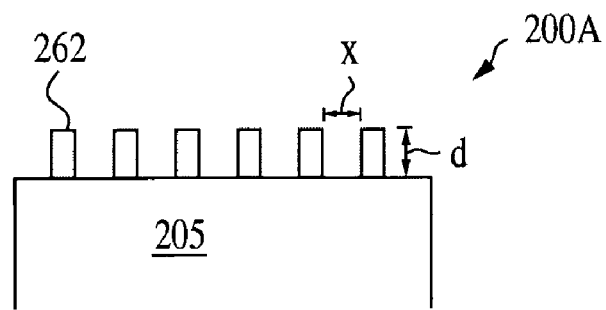

Using a mask level, the $Al_2O_3$ layer 261 is patterned and etched to create a photonic crystal structure of pillars 262, as depicted in FIGS. 3C and 3D. Referring to FIG. 3E, the ratio x/d of spacing x between the pillars 262 to the thickness d of layer 261 (or height of the pillars 262) can be varied to achieve desired characteristics of the photonic crystal. Illustratively, x/d is within the range of approximately 1 to approximately 10. Alternatively, spacer-defined lithography can also be used, particularly if patterning the pillars 262 to achieve a desired ratio x/d is a challenge with existing lithography techniques.

Figure 3F:
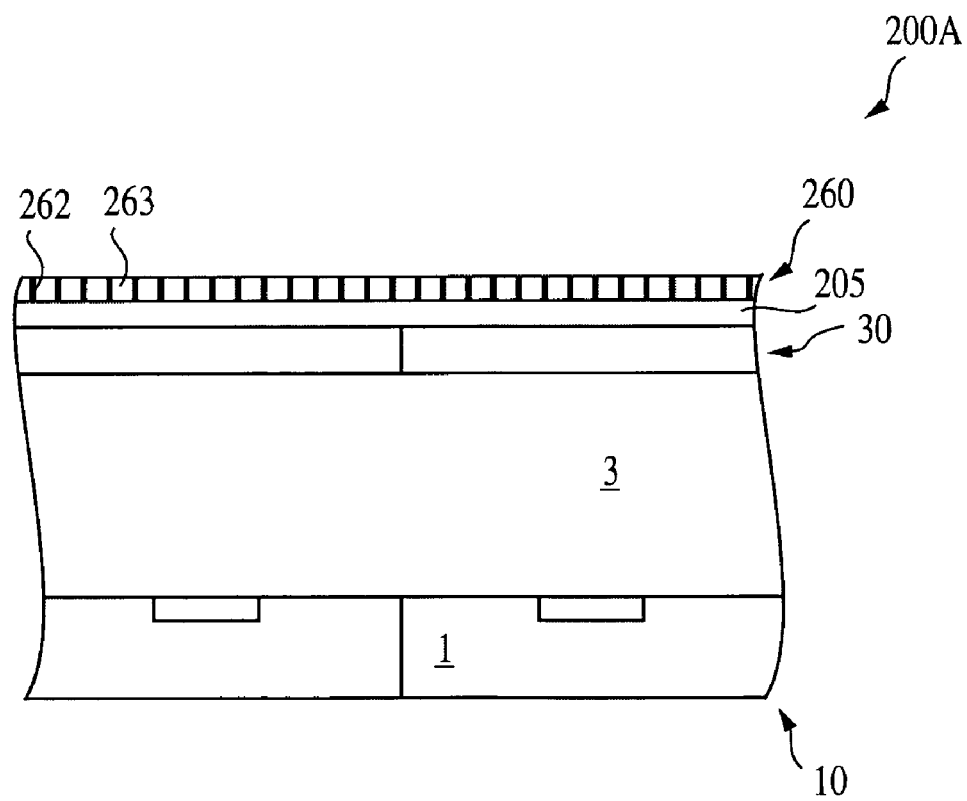

A layer 263 is deposited between the pillars 262 and planarized using a CMP step, as illustrated in FIG. 3F. The layer 263 can be formed of any suitable material having a low dielectric constant, for example, spun on glass (SOG) or $SiO_2$, among others. Any suitable technique may be used to form layer 263. For simplicity, the pillars 262 and layer 263 are depicted collectively as layer 260.

Figure 4A:
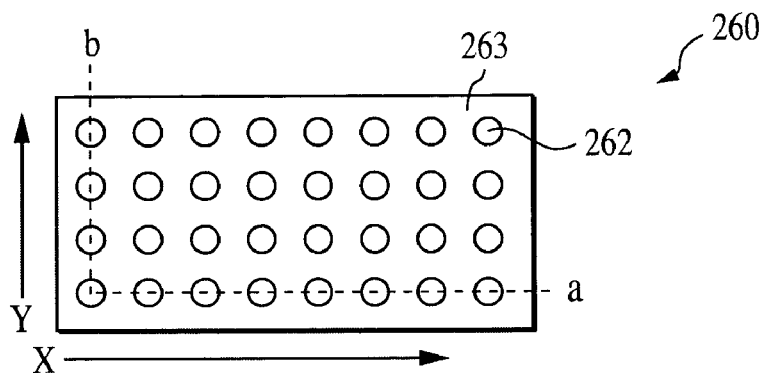
FIGS. 4A-4D are top down views of photonic crystal structures according to exemplary embodiments of the invention.
Figure 4B:
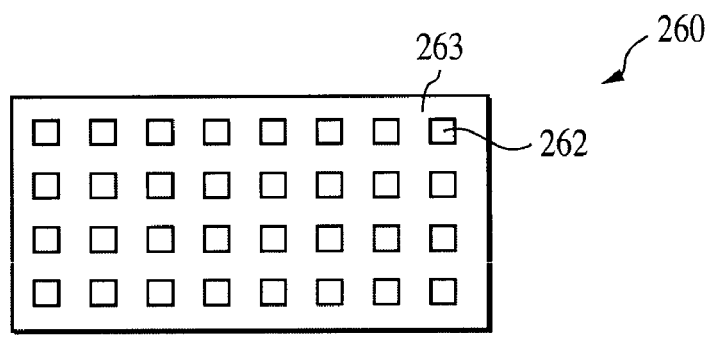
Figure 4C:
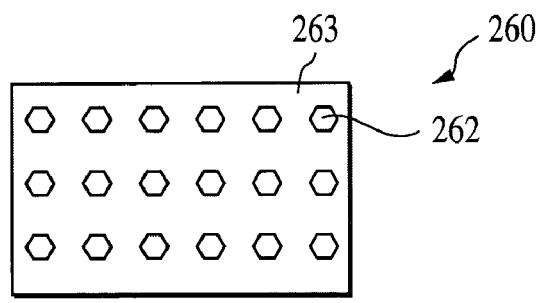

The pillars 262 can be formed having any desired horizontal cross-sectional shape. FIGS. 4A-4C depict exemplary pillar 262 shapes. FIG. 4A is a top plan view of layer 260 with pillars 262 having a circular horizontal cross-sectional shape (i.e., the pillars 262 are cylinders). FIGS. 4B and 4C depict layer 260 including pillars having rectangular and pentagonal horizontal cross-sectional shapes, respectively.

Figure 4D:
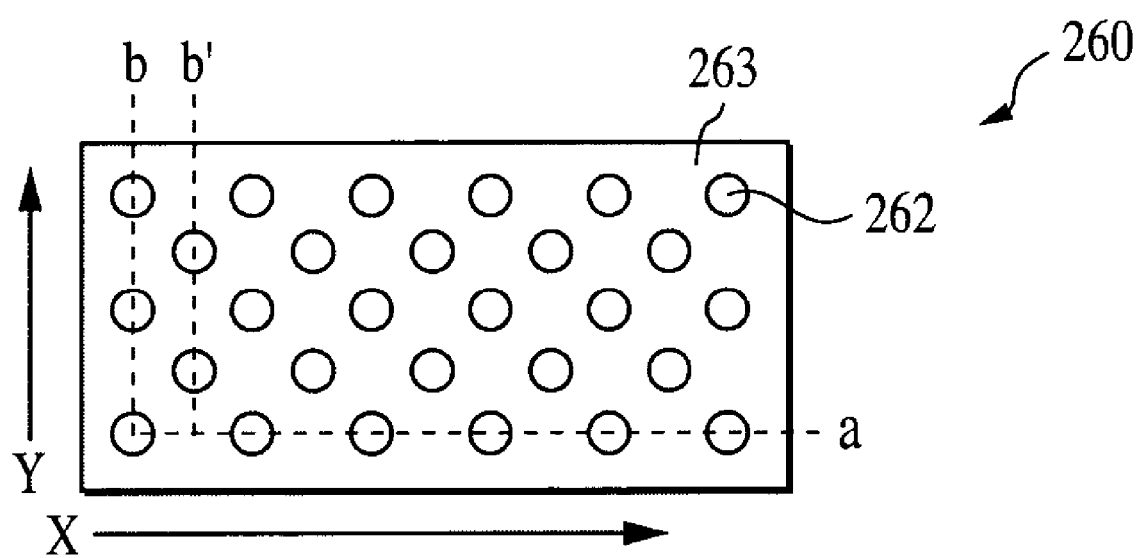

Also, the pillars 262 can be arranged in a variety of orientations. As shown in FIG. 4A, the pillars 262 are arranged in columns B in the Y direction and rows A in the X direction, such that a pillar 262 from each consecutive row A forms a column B in the Y direction. Alternatively, as shown in FIG. 4D, the pillars 262 can be arranged in rows along line A in the X direction with each row along line A being offset from an adjacent row A, such that pillars 262 from every other row A form a column B and B', respectively, in the Y direction.

Each thickness d, spacing x, x/d ratio, horizontal cross sectional shape of the pillars 262, orientation of the pillars 262, and the material of the pillars 262 and layer 263 are design variables. These design variables can be chosen to achieve a desired photonic crystal structure and, therefore, the desired properties of layer 260 and the lenses 220.

Figure 3G:
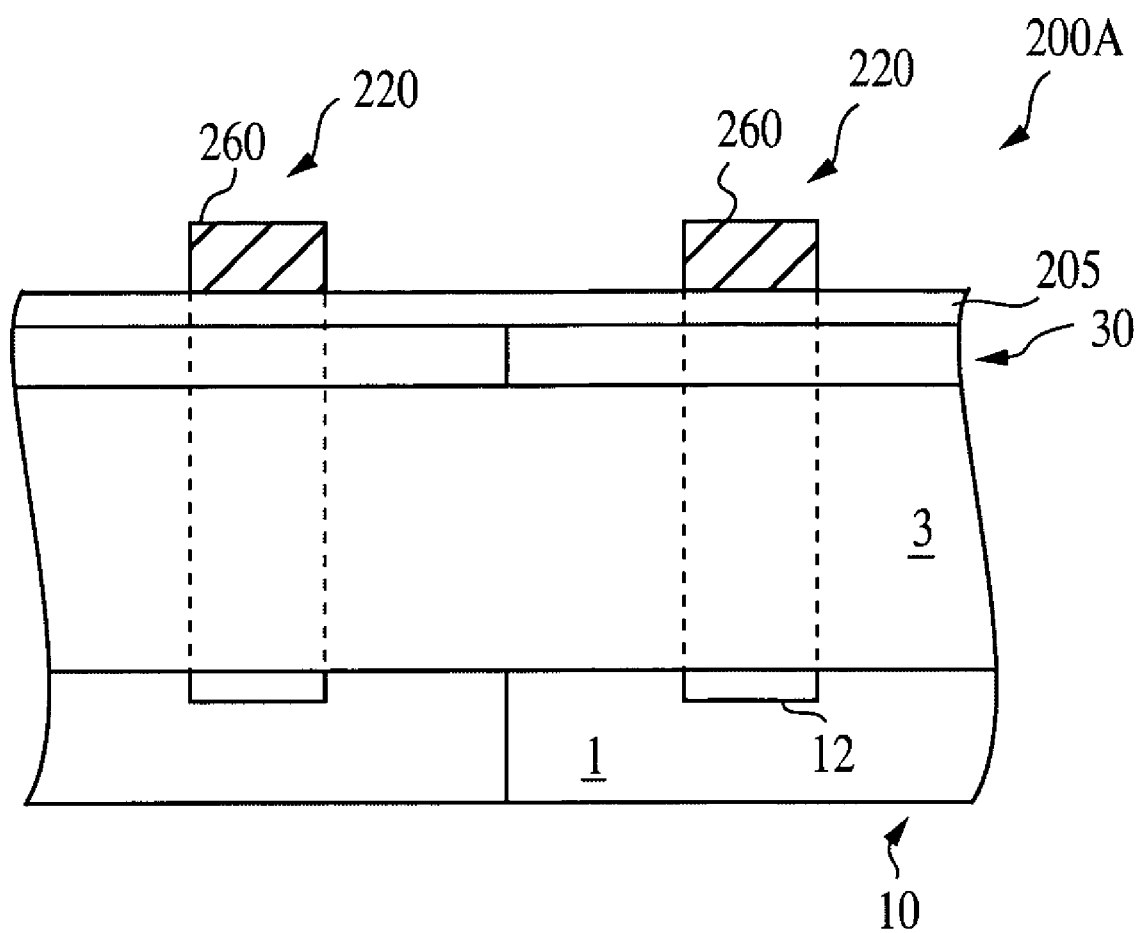

To achieve the structure shown in FIG. 3G, layer 260 is patterned and etched by known techniques to create the lens 220 directly over the photo-conversion devices 12. Layer 260 can be patterned to have any shape. In the exemplary embodiment depicted in FIG. 3G, layer 260 is patterned and etched to form a lens 220 having approximately the same shape as the photo-conversion device 12 when viewed from a top down perspective.

Figure 5:
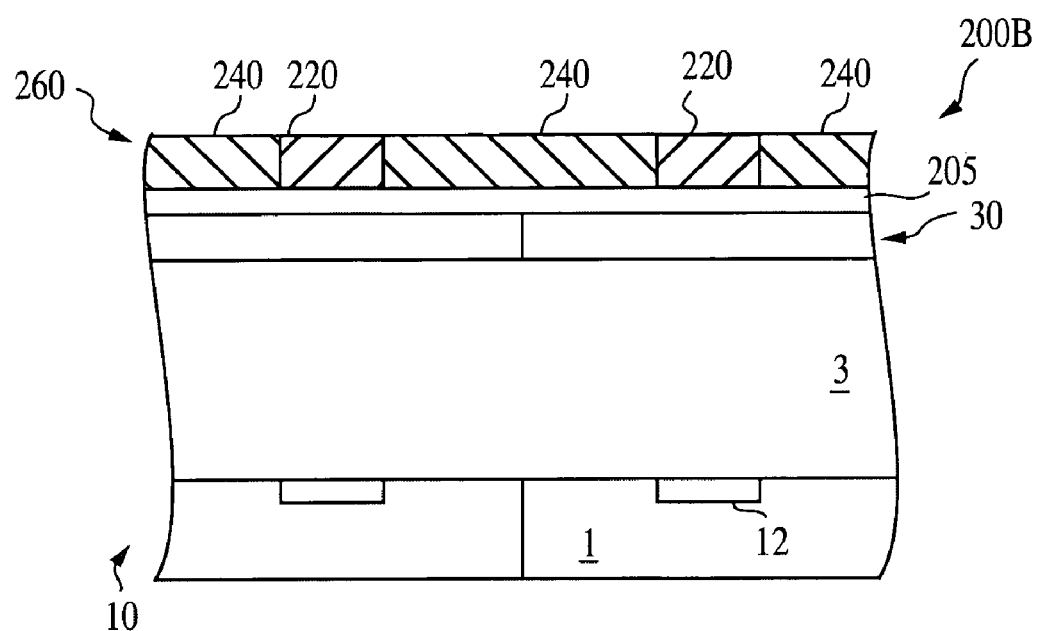
FIG. 5 is a cross sectional view of a portion of an image sensor array including photonic crystal lenses according to another exemplary embodiment of the invention.

FIG. 5 depicts a portion of an image sensor pixel cell array 200B according to another exemplary embodiment of the invention. In the exemplary embodiment of FIG. 5, the array 200B includes a light blocking region 240 between its lenses 220. The light blocking region 240 can be a single continuous region, or multiple discontinuous regions. In either case, the region 240 is formed as a portion of the layer 260 and has a photonic crystal structure. The photonic crystal structure of layer 260 in light blocking region 240 is formed such that light, or portions of light, are prevented from passing through region 240 to respective pixel cells 10, as will be explained in further detail below. In this manner, layer 260 has a first photonic crystal structure for lenses 220 and a second photonic crystal structure for light blocking region 240. The light blocking region 240 can serve in place of, or as a compliment to, the metal layer 7 (FIG. 1A).

According to another exemplary embodiment of the invention array 200B can be formed as described above in connection with FIGS. 3A-3F, except that layer 261 is patterned and etched such that any one or more of the design variables (e.g., thickness d of layer 261, the spacing x between the pillars 262, the ratio x/d, the horizontal cross sectional shape of the pillars 262, and the orientation of the pillars 262) is different in one or more regions of layer 260. That is, the photonic crystal structure of layer 260 can vary between regions of layer 260, to achieve the structure shown in FIG. 5.

Figure 6A:
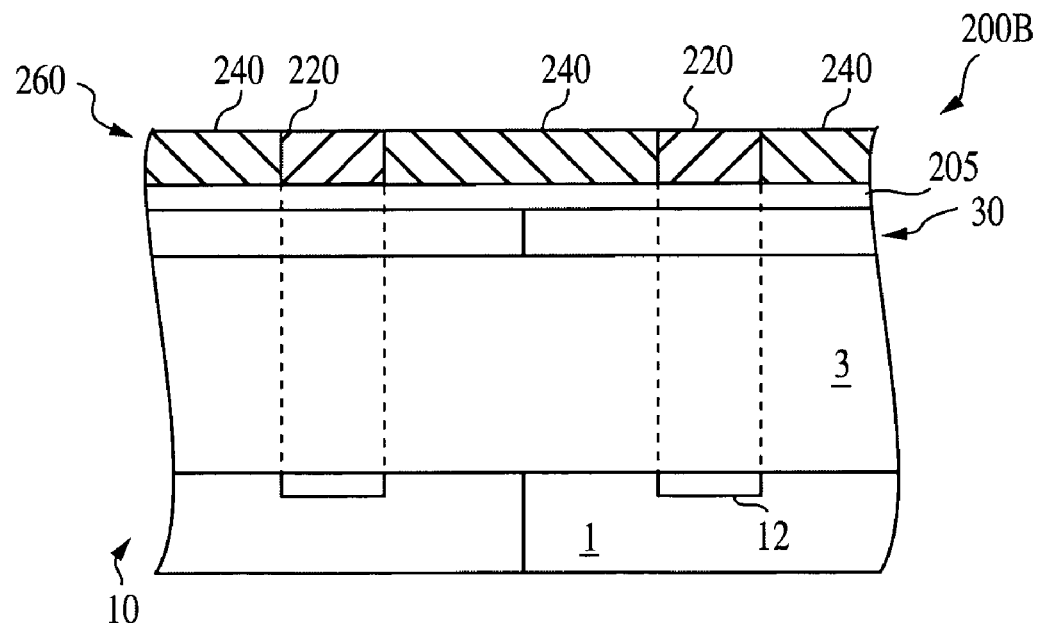
FIGS. 6A-6B illustrate intermediate stages of fabrication of the image sensor array of FIG. 5 according to another exemplary embodiment of the invention.
Figure 6B:
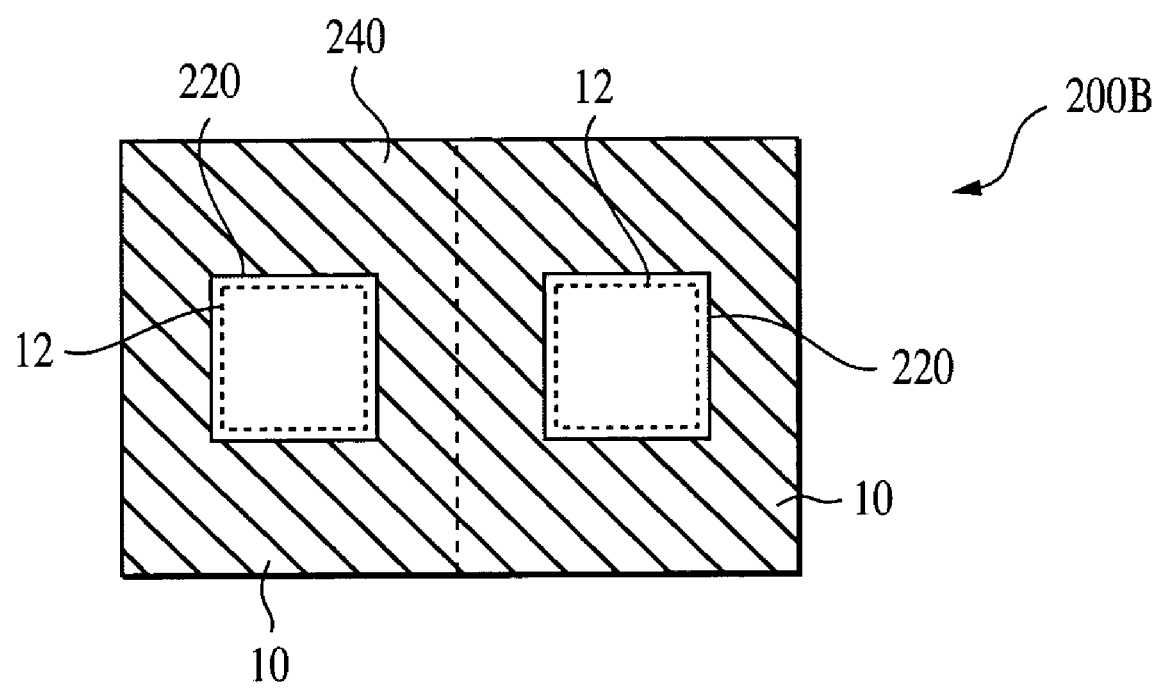

For example, referring to FIGS. 6A and 6B, layer 260 is patterned and etched such that lenses 220 and region 240 have different photonic crystal structures. Specifically, layer 260 is formed having a photonic crystal structure to achieve the desired lens 220 properties e.g., a negative refractive index. As in the embodiment of FIG. 2, the lenses 220 are formed directly above respective photo-conversion devices 12 and can be formed in approximately the same shape as respective photo-conversion devices 12 from a top down perspective, as illustrated in FIGS. 6A and 6B. FIG. 6B is a top plan view of a portion of the FIG. 6A array 200B, wherein the dotted lines show the underlying structures of the pixel cells 10 and photo-conversion devices 12. The layer 260 in the light blocking region 240, which is between lenses 220, is formed having a photonic crystal structure to prevent light, or a portion of light, from passing through the region 240.

Figure 7:
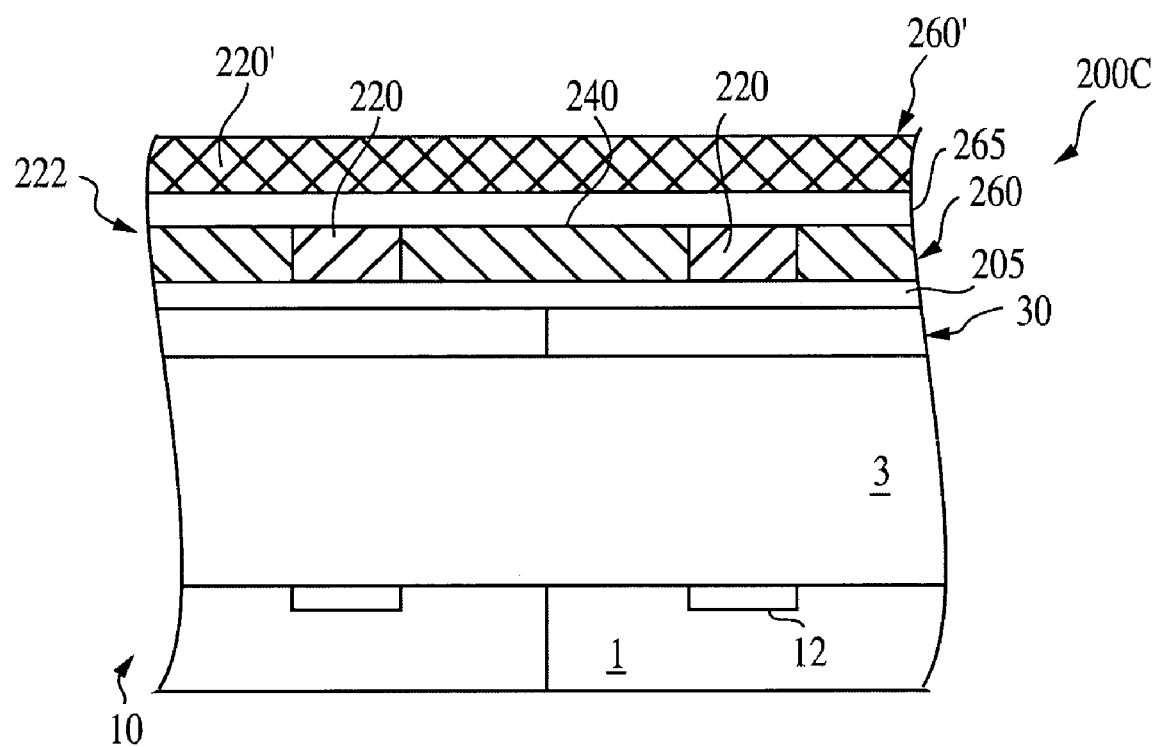
FIG. 7 is a cross sectional view of a portion of an image sensor array including photonic crystal lenses according to another exemplary embodiment of the invention.
Figure 8:
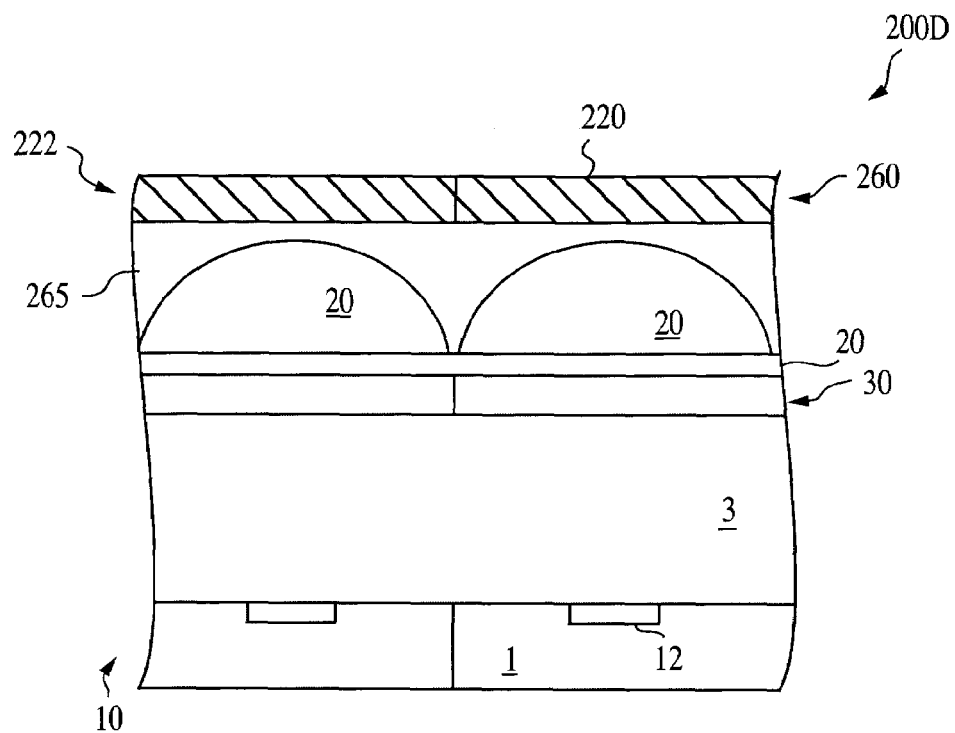
FIG. 8 is a cross sectional view of a portion of an image sensor array including photonic crystal lenses according to another exemplary embodiment of the invention.

The flat lenses 220 can also be incorporated in a multilayer lens system 222, as shown in FIGS. 7 and 8. FIG. 7 illustrates an array 200C with lenses 220 over respective photo-conversion devices 12 and a light blocking region 240 between the lenses 220. A second photonic crystal lens 220' is provided over the lenses 220 and region 240. As shown in FIG. 7, lens 220' can be a continuous approximately flat layer 260' including a photonic crystal structure. The photonic crystal structure of layer 260 can be different than that of layer 260'. Lenses 220 and 220' can be separated by a dielectric layer 265 if desired.

In another exemplary embodiment of the invention, the array 200C having a lens system 222 including lenses 220 and 220', as shown in FIG. 7, is formed in the same manner as array 200B of FIG. 5, but with additional processing steps. A dielectric layer 265 (e.g., a layer of $SiO_2$) is formed over layer 260 by techniques known in the art. The dielectric layer 265 is illustratively formed having a thickness within the range of approximately 50 Å to approximately 200 Å. A second photonic crystal layer 260' having a photonic crystal structure is formed over the dielectric layer 265. For clarity, elements with a reference numeral and a "'" are same general elements as those with corresponding reference numerals without the "'" but they can have a different specific chemical or photonic structure. Accordingly, layer 260' includes pillars 262 and layer 263 of low dielectric constant material, and can be formed in a similar manner to layer 260, as described above in connection with FIGS. 3B-3F and 4A-4D, except that layer 260' is formed over the dielectric layer 265 and can have a different photonic crystal structure than the photonic crystal structures of lenses 220 and region 240 of layer 260.

In the exemplary embodiment of FIG. 7, layer 260' is formed having a uniform photonic crystal structure and serves as a continuous lens 220' over the patterned lenses 220. As noted above, the photonic crystal structure of lens 220' can be different than the photonic crystal structure of lenses 220. That is, one or more of the design variables (e.g., the thickness d of layer 261, the spacing x between the pillars 262, the ratio x/d, the horizontal cross sectional shape of the pillars 262, the orientation of the pillars 262, and the materials of pillars 262 and layer 263) of layer 260' of lens 220' can be different than that of layer 260 of lenses 220.

Although the lens system 222 of FIG. 7 is shown including a continuous flat lens 220', it should be readily understood that layer 260' can instead be patterned and etched to form one or more lenses 220' over lenses 220. Additionally, layer 260' can be patterned to have multiple regions with different photonic crystal structures, such as, for example, light blocking regions 240.

FIG. 8 depicts an array 200D with conventional micro-lenses 20 underlying the photonic crystal lens 220. The micro-lenses 20 are separated by a planarized dielectric layer 265, which provides an approximately flat surface on which the lens 220 is formed.

Figure 9:
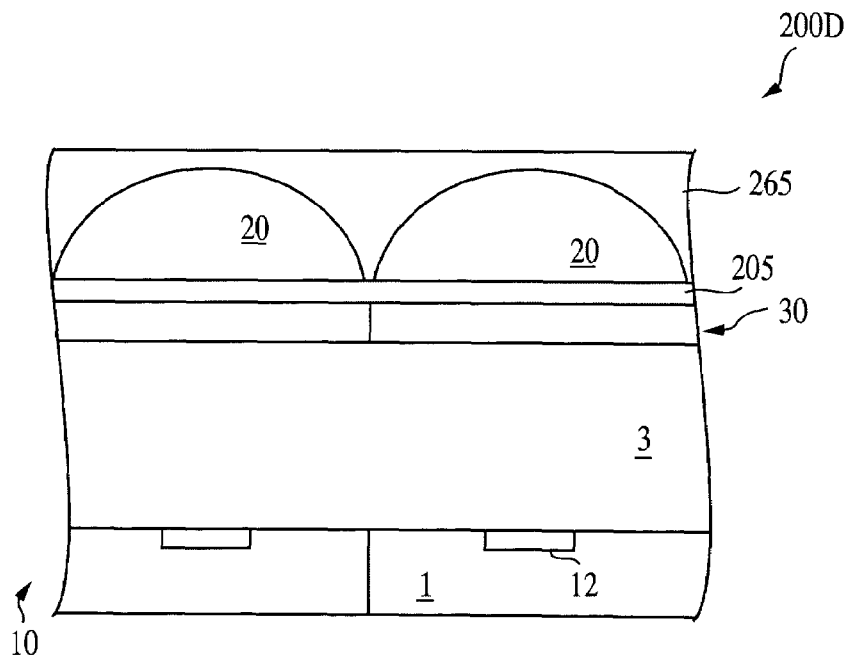
FIG. 9 illustrates an intermediate stage of fabrication of the image sensor array of FIG. 8 according to another exemplary embodiment of the invention.

The array 200D can be formed in a manner similar to array 200A, except that the lens 220 is formed over micro-lenses 20. As depicted in FIG. 9, a dielectric layer 265 (e.g., a layer of $SiO_2$) is formed over the micro-lenses 20 by techniques known in the art. Dielectric layer 265 is formed having a thickness greater than the thickness of the micro-lenses 20, such that dielectric layer 265 provides an approximately flat surface on which to form the lens 220. A photonic crystal layer 260 having a photonic crystal structure is formed over dielectric layer 265 forming lens 220 to achieve the structure shown in FIG. 8. Layer 260 can be formed over dielectric layer 265 as described above in connection with FIGS. 3B-3E and 4A-4D and includes pillars 262 and layer 263 of low dielectric constant material.

The photonic crystal structure of lens 220 can be formed to achieve the desired lens 220 properties. That is, design variables (thickness d of layer 261, the spacing x between the pillars 262, the ratio x/d, the horizontal cross sectional shape of the pillars 262, the orientation of the pillars 262, and the materials of the pillars 262 and layer 263 within layer 260' of lens 220') are chosen to achieve the desired photonic crystal structure of lens 220.

Although the lens system 222 of FIG. 8 is shown including a continuous flat lens 220, it should be readily understood that layer 260 can instead be patterned and etched to form one or more lenses 220 over micro-lenses 20. Additionally, layer 260 can be patterned to have multiple regions with different photonic crystal structures, such as, for example, light blocking regions 240.

Figure 10:
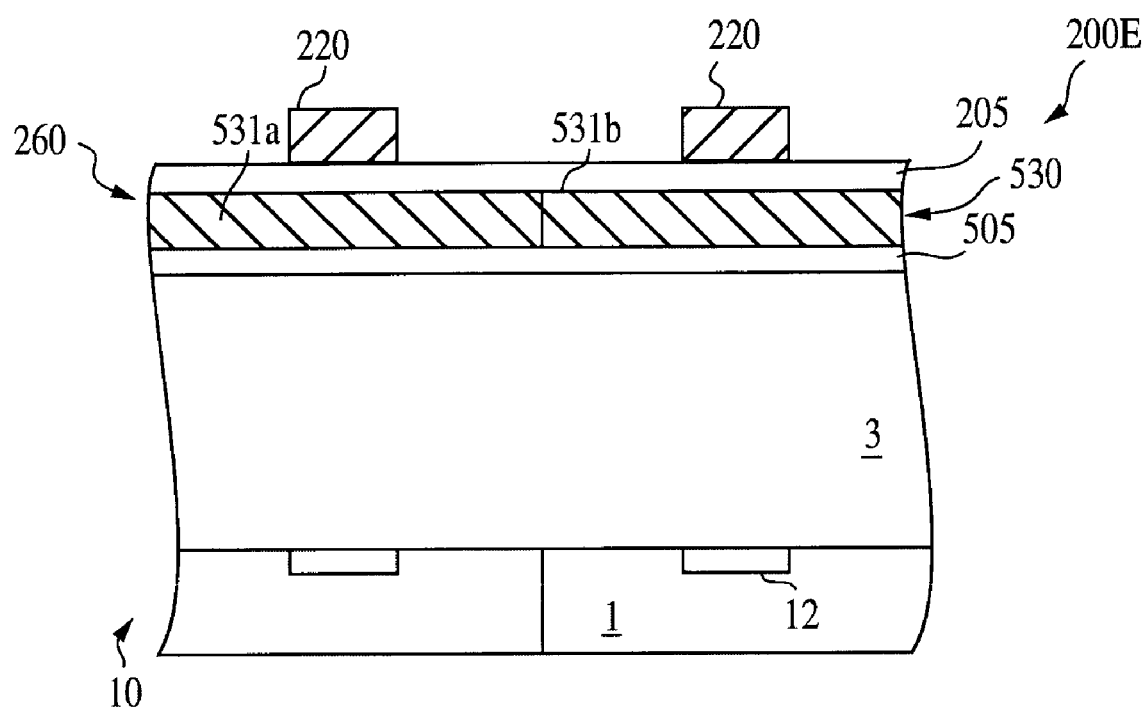
FIG. 10 is a cross sectional view of a portion of an image sensor array including photonic crystal lenses and a photonic crystal filter according to another exemplary embodiment of the invention.

According to another exemplary embodiment of the invention shown in FIG. 10, an array 200E can be formed having both photonic crystal lenses 220 and a photonic crystal filter 530 configured in a Bayer pattern as described in U.S. patent application Ser. No. 10/856,940, which is incorporated herein by reference. For this, the processing steps described above in connection with FIGS. 3A-3G can be performed with the processing steps described in U.S. patent application Ser. No. 10/856,940. Although the embodiment of FIG. 10 is illustrated as including lenses 220 (FIG. 2) and a Bayer patterned filter 530, it should be understood that any combination of photonic crystal lenses 220 and/or lens system 222 with one or more photonic crystal filters as described in U.S. patent application Ser. No. 10/856,940 can be used.

Figure 11:
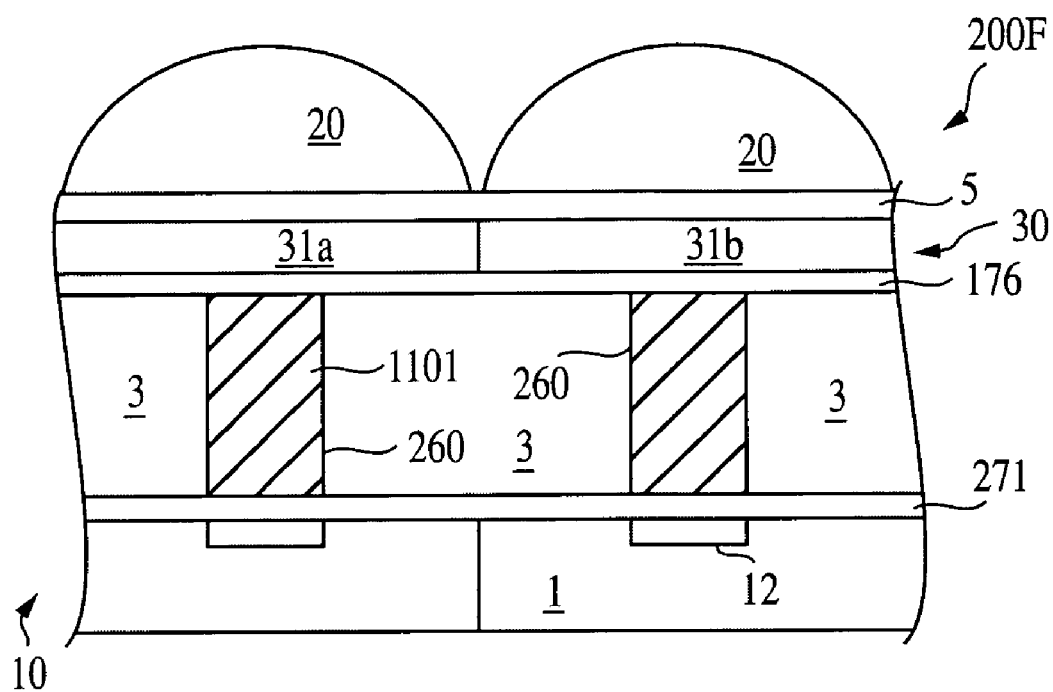
FIG. 11 is a cross sectional view of a portion of an image sensor array including photonic crystal lens elements according to another exemplary embodiment of the invention.

According to another exemplary embodiment of the invention illustrated in FIG. 11, an array 200F can be formed including a photonic crystal lens element 1101 in place of a portion of the ILD region 3 over the photo-conversion device 12 in one or more pixel cells 10. Accordingly, as shown in FIG. 11, the lens elements 1101 can be below micro lenses 20 and an optional color filter array 30. The lens elements 1101 have a photonic crystal structure that is configured to focus light onto a respective photo-conversion device 12. The lens element 1101 acts as a "light pipe" by directing light onto the photo-conversion device 12.

Preferably, the lens elements 1101 have a horizontal cross-sectional shape approximately matching that of the respective photo-conversion devices 12 and are approximately aligned with the respective photo-conversion devices 12. By replacing a portion of the ILD region 3 with the lens element 1101 in a pixel cell 10, light can be better directed to the photo-conversion device 12 and, thereby, quantum efficiency can be increased optical cross-talk between neighboring pixel cells 10 can be reduced.

The lens elements 1101 are a layer 260 having a photonic crystal structure and can be formed as described above in connection with FIGS. 3B-3E and 4A-4D. Accordingly, the lens element 1101 includes pillars 262 and layer 263 of low dielectric constant material. The lens element 1101 can be formed on the TEOS layer 271. The lens element 1101 can be formed before or after the layers 272-275 of the ILD region 3.

The layer 260 of each of the lens elements 1101 can have a photonic crystal structure different from that of other lens elements 1101. Accordingly, where pixel cells 10 receive different wavelengths of light, the photonic crystal structure of the layer 260 for a particular lens element 1101 can be configured to direct a specific range of wavelengths onto the respective photo-conversion device 12. For example, when a Bayer patterned color filter array 30 is used, as in the illustrated embodiment, the lens element 1101 below the color filter 31a can be configured to direct green wavelengths of light onto the underlying photo-conversion device 12, the lens element 1101 below the color filter 31b can be configured to direct red wavelengths of light onto the underlying photo-conversion device 12, and the lens element 1101 below the color filter 31c (not shown) can be configured to direct blue wavelengths of light onto the underlying photo-conversion device 12. Alternatively, when no color filter array 30 is used, the lens element 1101 can be configured to be selective for particular wavelengths of light and direct only those particular wavelengths to the photo-conversion device 12, while preventing other wavelengths of light from reaching the photo-conversion device 12. In this manner, the lens element 1101 can act as both a lens and a filter.

Figure 12:
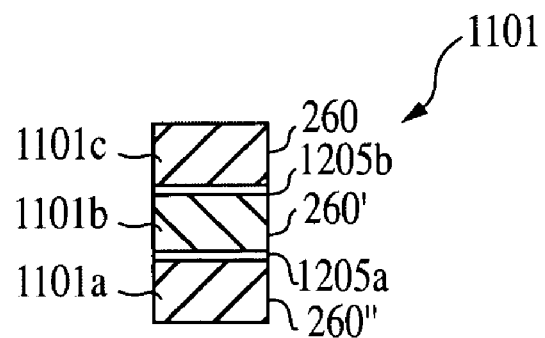
FIG. 12 is a cross sectional view of a photonic crystal lens element according to another exemplary embodiment of the invention.

In an alternative embodiment, the lens element 1101 can include more than one layer 260. As shown in FIG. 12, the lens element 1101 can include layers 260, 260' and 260". One or more of the layers 260, 260' and 260" can have a different photonic crystal structure from another of the layers 260, 260' and 260". The layers 260, 260' and 260" are separated from one another by dielectric layers 1205.

Figure 13:
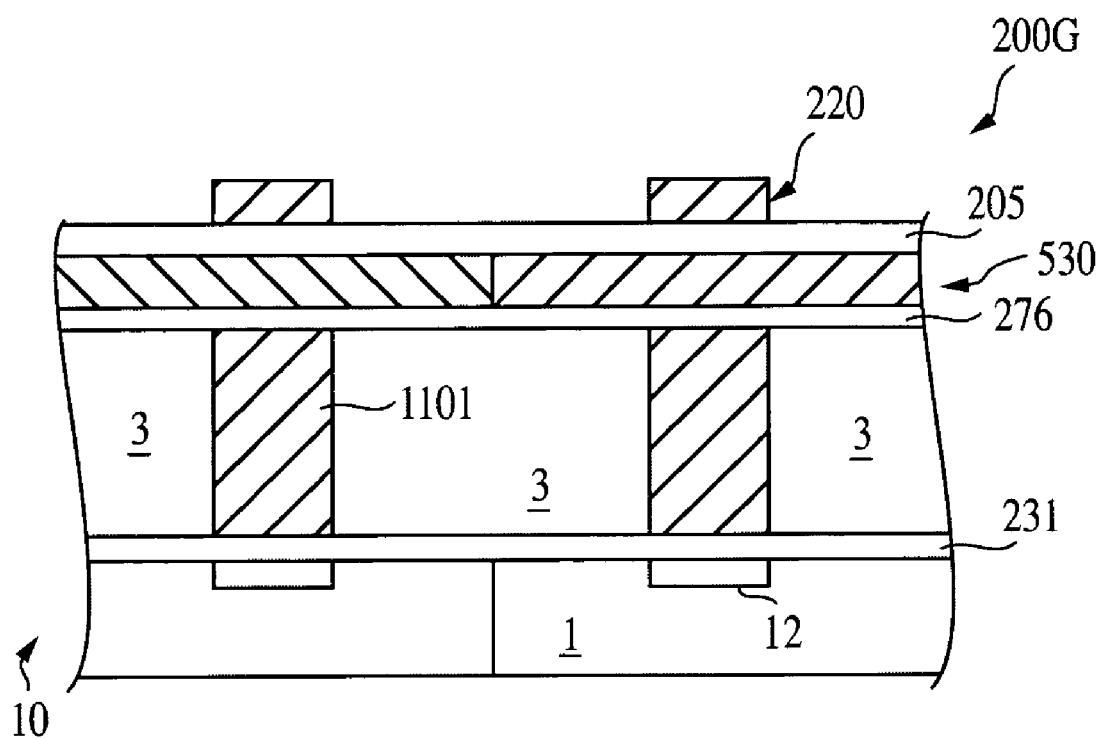
FIG. 13 is a cross sectional view of a portion of an image sensor array including photonic crystal lens elements, photonic crystal lenses, and photonic crystal filters according to another exemplary embodiment of the invention.

According to another exemplary embodiment of the invention shown in FIG. 13, an array 200G can be formed having photonic crystal elements 1101, photonic crystal lenses 220, and a photonic crystal filter 530 configured in a Bayer pattern as described in U.S. patent application Ser. No. [M4065.1022]. Although the embodiment of FIG. 13 is illustrated as including lens elements 1101 (FIG. 11), lenses 220 (FIG. 2) and a Bayer patterned filter 530, it should be understood that any combination of photonic crystal lens elements 1101, photonic crystal lenses 220 and/or lens system 222, and one or more photonic crystal filters as described in U.S. patent application Ser. No. [M4065.1022] can be used. Additionally, conventional filters and/or lenses can be used in connection with or in place of the photonic crystal-based components.

Figure 14:
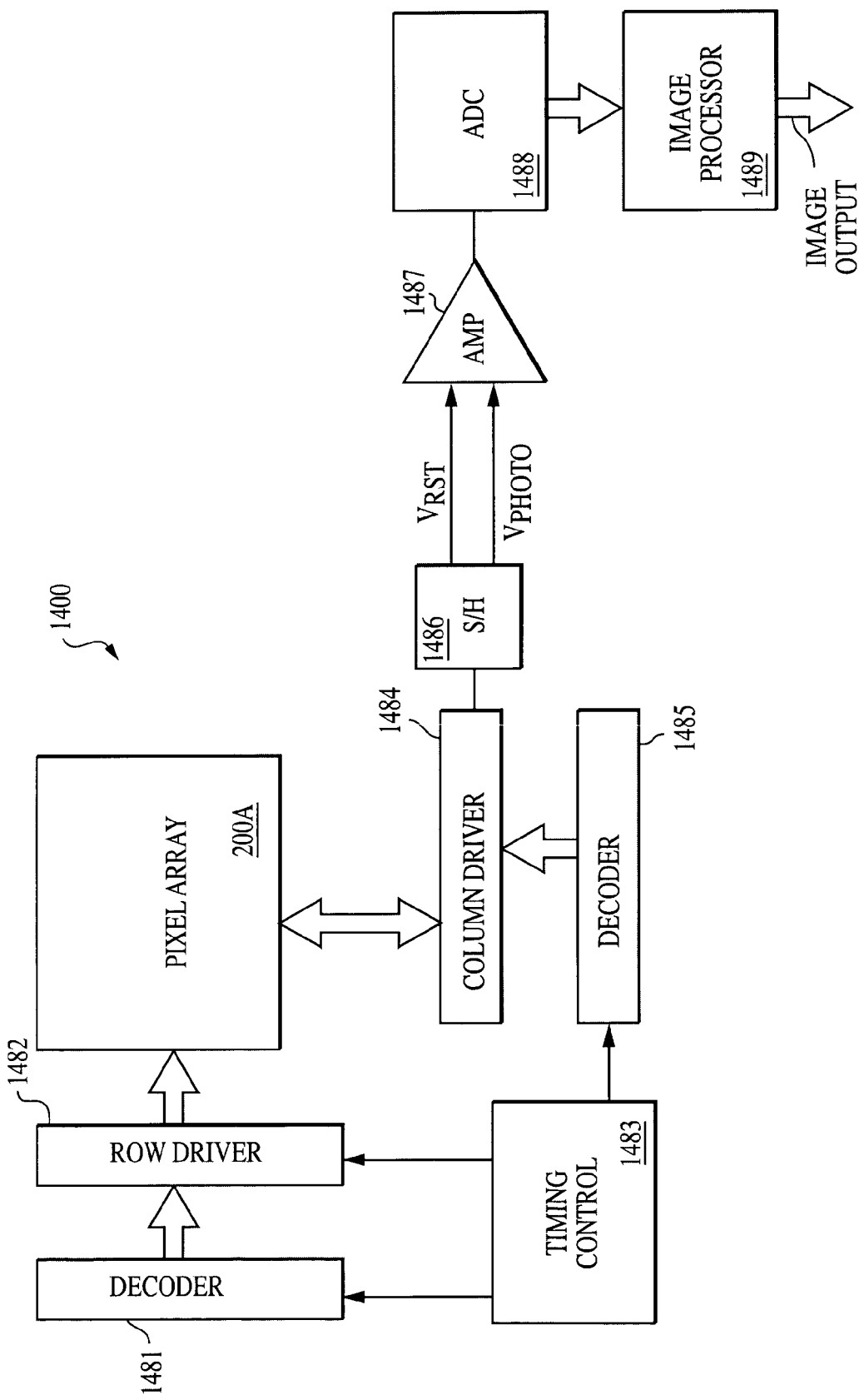
FIG. 14 is a block diagram of an image sensor according to another embodiment of the invention.

A typical single chip CMOS image sensor 1400 is illustrated by the block diagram of FIG. 14. The image sensor 1400 includes a pixel cell array 200A according to an embodiment of the invention. The pixel cells of array 200A are arranged in a predetermined number of columns and rows. Alternatively, the image sensor 1400 can include any pixel cell array according to an embodiment of the invention, such as any of arrays 200B-G.

The rows of pixel cells in array 200A are read out one by one. Accordingly, pixel cells in a row of array 200A are all selected for readout at the same time by a row select line, and each pixel cell in a selected row provides a signal representative of received light to a readout line for its column. In the array 200A, each column also has a select line, and the pixel cells of each column are selectively read out in response to the column select lines.

The row lines in the array 200A are selectively activated by a row driver 1482 in response to row address decoder 1481. The column select lines are selectively activated by a column driver 1484 in response to column address decoder 1485. The array 200A is operated by the timing and control circuit 1483, which controls address decoders 1481, 1485 for selecting the appropriate row and column lines for pixel signal readout.

The signals on the column readout lines typically include a pixel reset signal ($V_{rst}$) and a pixel image signal ($V_{sig}$) for each pixel cell. Both signals are read into a sample and hold circuit (S/H) 1486 in response to the column driver 1484. A differential signal ($V_{rst}-V_{sig}$) is produced by differential amplifier (AMP) 1487 for each pixel cell, and each pixel cell's differential signal is amplified and digitized by analog-to-digital converter (ADC) 1488. The analog-to-digital converter 1488 supplies the digitized pixel signals to an image processor 1489, which performs appropriate image processing before providing digital signals defining an image output.

Figure 15:
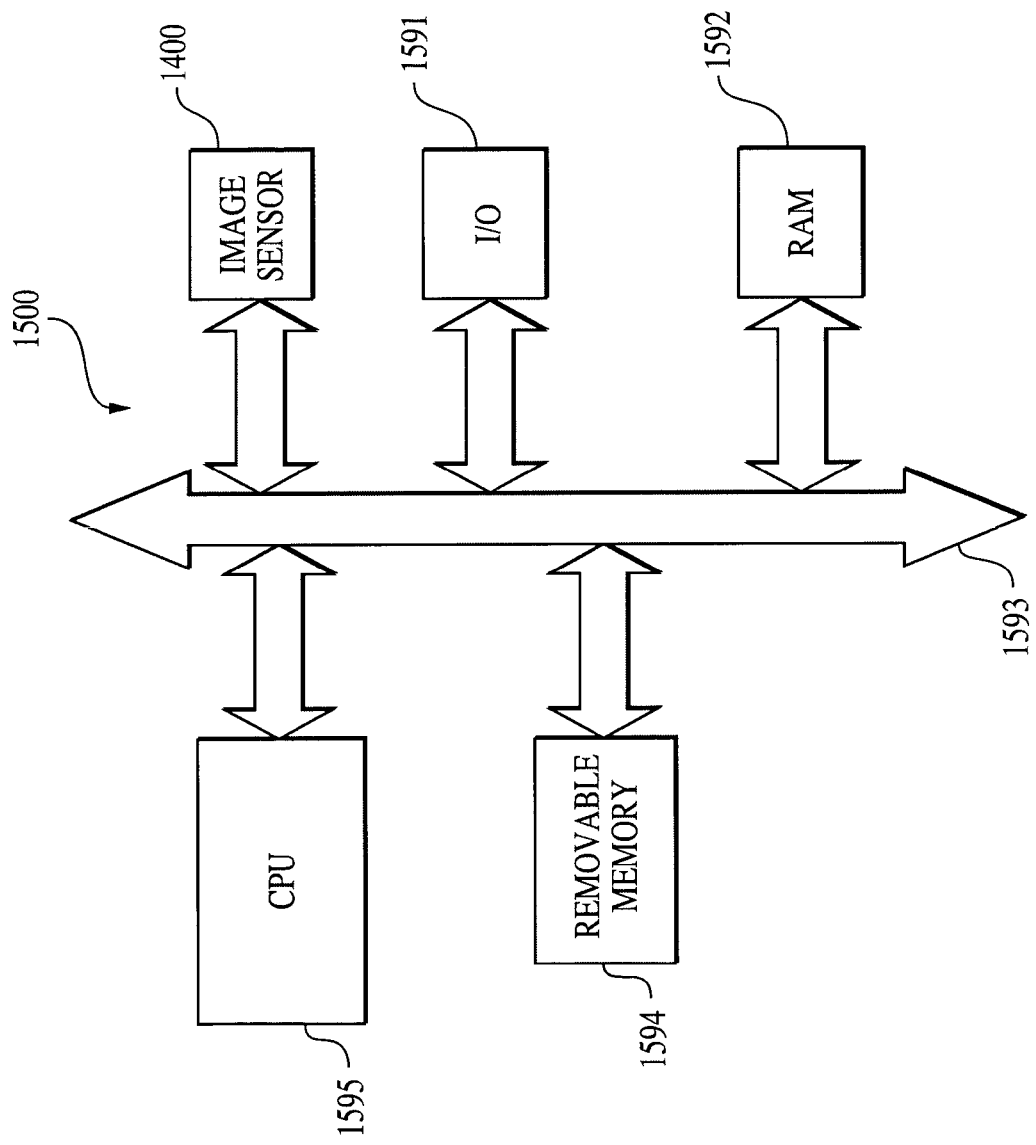
FIG. 15 is a block diagram of a processor system including the image sensor of FIG. 14.

FIG. 15 illustrates a processor-based system 1500 including the image sensor 1400 of FIG. 14. The processor-based system 1500 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-based system 1500, for example a camera system, generally comprises a central processing unit (CPU) 1595, such as a microprocessor, that communicates with an input/output (I/O) device 1591 over a bus 1593. Image sensor 1400 also communicates with the CPU 995 over bus 1593. The processor-based system 1500 also includes random access memory (RAM) 1592, and can include removable memory 1594, such as flash memory, which also communicate with CPU 1595 over the bus 1593. Image sensor 1400 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. An image sensor comprising:
   an array of pixel cells at a surface of a substrate, each pixel cell comprising a photo-conversion device; and
   at least one photonic crystal lens element over the substrate configured to focus light onto at least one photo-conversion device, wherein a shape of the photonic crystal lens element is approximately the same shape as the photo-conversion device and the photonic crystal lens element is approximately aligned with the photo-conversion device.

2. An image sensor comprising:
   an array of pixel cells at a surface of a substrate, each pixel cell comprising a photo-conversion device; and
   at least one lens element having a photonic crystal structure over at least one of the photo-conversion devices for focusing light onto the at least one photo-conversion device wherein the photonic crystal lens element comprises a plurality of pillars spaced apart from each other, and a material within the spacing between the pillars has a dielectric constant that is lower than a dielectric constant of the pillars.

3. An image sensor comprising:
   an array of pixel cells at a surface of a substrate, each pixel cell comprising a photo-conversion device; and
   at least one lens element over at least one of the photo-conversion devices, the lens element comprising a photonic crystal structure comprising a plurality of pillars spaced apart from each other and a material within the spacing between the pillars, the material having a dielectric constant that is different than a dielectric constant of the pillars.

4. An image sensor comprising:

an array of pixel cells at a surface of a substrate, each pixel cell comprising a photo-conversion device; and at least one photonic crystal lens element over the substrate configured to focus light onto at least one photo-conversion device, wherein the photonic crystal lens element comprises a plurality of pillars being spaced apart from each other, and wherein the photonic crystal lens element further comprises a material within the spacing between the pillars, the material having a dielectric constant that is lower than a dielectric constant of the pillars.

5. The image sensor of claim 4, wherein the pillars comprise aluminum oxide.

6. The image sensor of claim 4, wherein the photonic crystal lens element has a top surface and a bottom surface, the top and bottom surfaces being approximately parallel with respect to each other.

7. The image sensor of claim 4, wherein the photonic crystal lens element is configured to have a negative index of refraction.

8. A photonic crystal lens element for an image sensor, the lens element comprising:

a substrate;

a plurality of pillars over the substrate forming a photonic crystal structure configured to focus electromagnetic radiation, the pillars being spaced apart from each other; and a material within the spacing between the pillars having a dielectric constant that is different than a dielectric constant of the pillars.

9. The photonic crystal lens element of claim 8, wherein the dielectric constant of the material within the spacing is lower than the dielectric constant of the pillars.

10. The photonic crystal lens element of claim 8, wherein the pillars and material within the spacing together have an approximately flat top surface.

11. The photonic crystal lens element of claim 8, wherein the pillars have a height within the range of approximately 100 Å to approximately 5000 Å.

12. The photonic crystal lens element of claim 8, wherein a ratio of the spacing between any two of the pillars to a height of any one of the pillars is within the range of approximately 1 to approximately 10.

13. The photonic crystal lens element of claim 8, wherein the pillars each have a circular horizontal cross sectional shape.

14. The photonic crystal lens element of claim 8, wherein the pillars each have a pentagonal horizontal cross sectional shape.

15. The photonic crystal lens element of claim 8, wherein the pillars each have a rectangular horizontal cross sectional shape.

16. The photonic crystal lens element of claim 8, wherein the pillars comprise aluminum oxide.

17. The photonic crystal lens element of claim 8, wherein the pillars comprise tantalum oxide.

18. The photonic crystal lens element of claim 8, wherein the pillars comprise zirconium oxide.

19. The photonic crystal lens element of claim 8, wherein the pillars comprise hafnium oxide.

20. The photonic crystal lens element of claim 8, wherein the pillars comprise a Hafnium-based silicate.

21. The photonic crystal lens element of claim 8, wherein the material within the spacing is spun-on glass.

22. The photonic crystal lens element of claim 8, wherein the material within the spacing is silicon dioxide.

23. The photonic crystal lens element of claim 8, further comprising a base layer over the substrate, the pillars being formed on the base layer.

24. The photonic crystal lens element of claim 23, wherein the base layer has an approximately flat top surface.

25. The photonic crystal lens element of claim 23, wherein the base layer comprises a dielectric material.

26. The photonic crystal lens element of claim 8, wherein the photonic crystal structure is configured to have a negative index of refraction.

* * * * *

UNITED STATES PATENT AND TRADEMARK OFFICE
CERTIFICATE OF CORRECTION

| | |
|---|---|
| PATENT NO. | : 7,427,798 B2 |
| APPLICATION NO. | : 10/886125 |
| DATED | : September 23, 2008 |
| INVENTOR(S) | : Mouli |

Page 1 of 1

It is certified that error appears in the above-identified patent and that said Letters Patent is hereby corrected as shown below:

On the Title page, in field (56), under "Other Publications", in column 2, line 17, delete "solitions,"" and insert -- solitons," --, therefor.

In column 10, line 56, in Claim 2, before "wherein" insert -- , --.

Signed and Sealed this

Twenty-fifth Day of November, 2008

JON W. DUDAS
*Director of the United States Patent and Trademark Office*